United States Patent
Kanthasamy et al.

(10) Patent No.: US 10,019,543 B1
(45) Date of Patent: Jul. 10, 2018

(54) CONVERTING FINITE ELEMENT MODELS TO CAD MODELS USING FEATURE RECOGNITION

(71) Applicant: MSC.Software Corporation, Santa Ana, CA (US)

(72) Inventors: Kunaseelan Kanthasamy, Irvine, CA (US); Gongdao Chen, Irvine, CA (US)

(73) Assignee: MSC. Software Corporation, Newport Beach, CA (US)

( * ) Notice: Subject to any disclaimer, the term of this patent is extended or adjusted under 35 U.S.C. 154(b) by 769 days.

(21) Appl. No.: 14/458,093

(22) Filed: Aug. 12, 2014

(51) Int. Cl.
*G06F 17/50* (2006.01)

(52) U.S. Cl.
CPC .......... *G06F 17/5018* (2013.01); *G06F 17/50* (2013.01)

(58) Field of Classification Search
CPC ..................................... G06F 17/50
USPC ................................................ 703/1
See application file for complete search history.

(56) References Cited

U.S. PATENT DOCUMENTS

| | | | |
|---|---|---|---|
| 2005/0264561 A1* | 12/2005 | Anast ................. | G06F 17/5018 345/420 |
| 2009/0271156 A1* | 10/2009 | Kageura ............. | G06F 17/5018 703/1 |
| 2011/0125464 A1* | 5/2011 | Ide ..................... | G06F 17/5018 703/1 |
| 2015/0127301 A1* | 5/2015 | Seibold ............... | G06F 17/50 703/1 |

FOREIGN PATENT DOCUMENTS

CN 101504678 A * 8/2009

OTHER PUBLICATIONS

Wenbin Song, Turbine Blade fir-tree root design optimisation using intelligent CAD and finite element analysis, May 2002.*

* cited by examiner

*Primary Examiner* — Lechi Truong
(74) *Attorney, Agent, or Firm* — Foley & Lardner LLP

(57) ABSTRACT

A method of creating a CAD model from a finite element model includes identifying and characterizing features of interest from the finite element model. Multiple intermediate data structures of the finite element model are created by dividing the input mesh of the finite element model into mesh regions. Feature recognition is performed on each intermediate data structure to identify finite element model features. Features and feature properties are extracted from the finite element model, and a CAD model is created using the extracted features and feature properties.

14 Claims, 7 Drawing Sheets

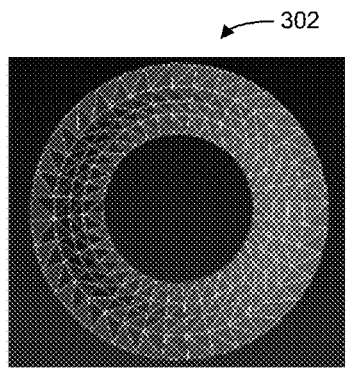
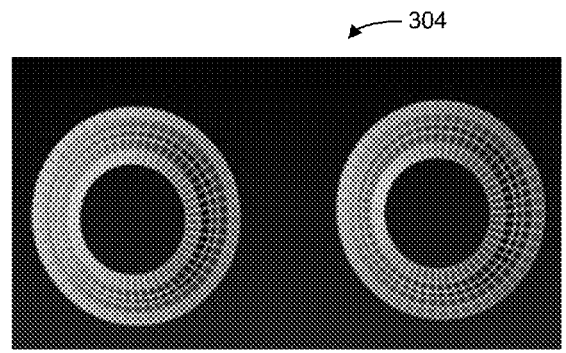
FIG. 3A  FIG. 3B
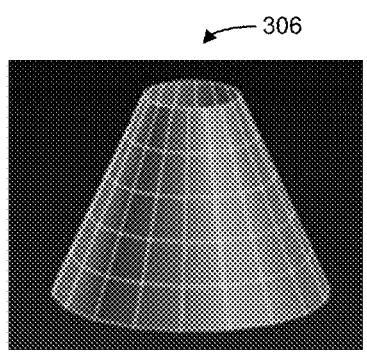
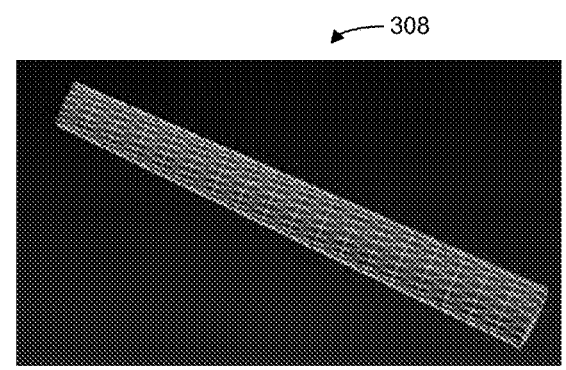
FIG. 3C  FIG. 3D
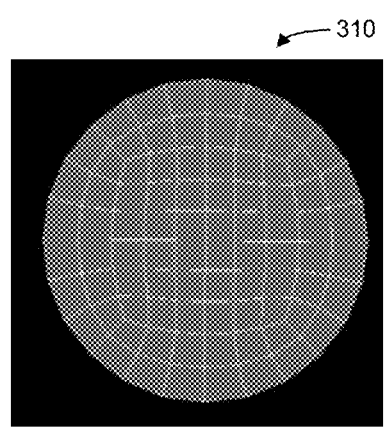
FIG. 3E

CONVERTING FINITE ELEMENT MODELS TO CAD MODELS USING FEATURE RECOGNITION

BACKGROUND

The present disclosure relates generally to finite element methods and systems. More particularly, the present disclosure relates to generation of computer-aided design (CAD) models.

SUMMARY

One embodiment of the present disclosure relates to a method for creating a CAD model using a finite element model. The method includes identifying and characterizing features of interest from a finite element model. The method further includes creating multiple intermediate data structures of the finite element model by dividing the input mesh of the finite element model into mesh regions. The method further includes performing feature recognition on each intermediate data structure to identify finite element model features. The method further includes extracting features and feature properties from the finite element model. The method further includes creating a CAD model using the extracted features and feature properties.

BRIEF DESCRIPTION OF THE FIGURES

The disclosure will become more fully understood from the following detailed description, taken in conjunction with the accompanying figures, wherein like reference numerals refer to like elements, in which:

FIGS. 3A-E illustrate example features of interest that may be identified on a finite element model;

DETAILED DESCRIPTION OF THE EXEMPLARY EMBODIMENTS

The detailed description set forth below in connection with the appended drawings is intended as a description of various aspects of the present disclosure and is not intended to represent the only aspects in which the present disclosure may be practiced. Each aspect described in this disclosure is provided merely as an example or illustration of the present disclosure, and should not necessarily be construed as preferred or advantageous over other aspects. The detailed description includes specific details for providing a thorough understanding of the present disclosure. However, it will be apparent to those skilled in the art that the present disclosure may be practiced without these specific details. In some instances, well-known structures and devices are shown in block diagram form in order to avoid obscuring the concepts of the present disclosure. Acronyms and other descriptive terminology may be used merely for convenience and clarity and are not intended to limit the scope of the present disclosure.

While for purposes of simplicity of explanation, the methodologies are shown and described as a series of acts, it is to be understood and appreciated that the methodologies are not limited by the order of acts, as some acts may, in accordance with one or more aspects, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with one or more aspects.

Referring generally to the figures, systems and methods for CAD model generation are shown and described. The systems and methods described herein allow for an integrated approach of converting a two-dimensional or three-dimensional finite element model and its features and parameters into a CAD model. Features of the finite element model are identified and extracted, and the features are them formalized in terms of CAD model features and used with the feature parameters to create the CAD model.

The systems and methods described herein allow for a full integration between the finite element model and the CAD model and CAD system. Using the original finite element model, the CAD system may generate a CAD model using the features and parameters identified from the finite element model. The CAD system may be configured to generate a CAD model compatible with any type of software (e.g., Parasolid, CATIA, UG, ProE, etc.).

Figure 1:
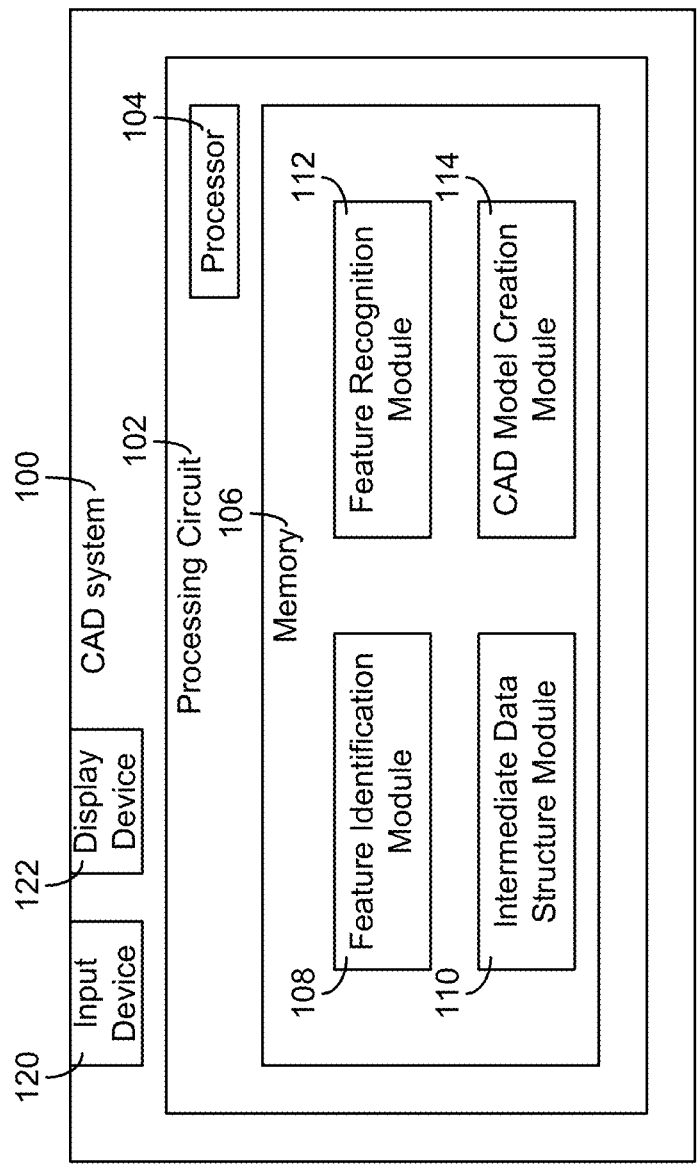
FIG. 1 is a block diagram of a CAD system configured to execute the systems and methods of the present disclosure.

Referring now to FIG. 1, a block diagram of a CAD system 100 is shown, according to an exemplary embodiment. CAD system 100 may generally be a computing system configured to execute the systems and methods described herein. For instance, CAD system 100 may generally be configured to identify features and associated parameters in a finite element model, and to convert the features to generate a parametric and feature-based CAD model. CAD system 100 is described with respect to a system and method for identifying such features and using the features to build a CAD model; CAD system 100 may further provide other general CAD system functionality which is not within the scope of the present disclosure.

CAD system 100 includes a processing circuit 102 including a processor 104 and memory 106. CAD system 100 further includes an input device 120 and display device 122. Processor 104 may be, but is not limited to being, an Intel® designed processor, AMD® designed processor, Apple® designed processor, QUALCOMM® designed processor, or ARM® designed processor. Memory (or storage device) 106 may include a memory such as a random access memory (RAM) or other dynamic storage devices. In another implementation, memory 106 may also include non-transitory storage media that is configured to store information regarding the finite element model or CAD model. In one embodiment, memory 106 may be a remote storage device that stores CAD system 100 data in a different location than CAD system 100 or input device 120. In another embodiment, memory 106 may be located on the same computer system as CAD system 100 or input device 120.

Input device 120 may be or include a computer with a monitor, keyboard, keypad, mouse, joystick, or other input devices performing a similar function. Input device 120 may include a keyboard including alphanumeric and other keys, and may be connected to CAD system 100 for communicating information and command selections to processor 104. Input device 120 may include a touch screen interface or movement sensing interface that may be combined with, or separated from, display device 122. Input device 120 may include a cursor control device, such as a mouse, trackball, touch screen, motion sensor, or cursor direction keys, for communicating direction information and command selections to processor 104 and for controlling cursor movement on display device 122. Display device 122 may be any type of display (e.g., CRT display, LCD display, etc.) configured to provide a visual output to a user of CAD system 100 and the data processing system.

Memory 106 is shown to include various modules for completing the activities described herein. For example, memory 106 includes a feature identification module 108 generally configured to identify and characterize features of interest for a given finite element module. Feature identification module 108 may generally be provided the mesh of the finite element model (e.g., a triangular mesh) and a feature angle of the finite element model (e.g., 30 degrees, 40 degrees, 50 degrees, etc.). Feature identification module 108 is configured to identify features of interest from the finite element model by creating pre-defined geometrical patterns on the finite element model and using the patterns to recognize features on the finite element model. In other words, feature identification module 108 may generally identify features likely to be present in the finite element model; and the other modules of system 100 may identify and extract such features. The feature types may generally be features having regular shapes and well-formed characteristics that allow the features to be identified by module 108. Feature types that may be identified by module 108 may include, for example, cylinder, chamfer, fillet, 4-sided face, hole, ring, frustrum, and disk. Features may further include various types of semi- and quarter-features, such as semi-cylinders, semi-rings, semi-disks, quarter-disks, etc. Features may further include composite features such as washers (i.e., several connected concentric rings), rolling fillets (i.e., several consecutive connected fillets and corner fillets), beads (several circular layers of rolling fillets with or without a centric disk region), or flanges (several layers of rolling four-sided features). Feature identification is described in greater detail in FIG. 3F.

Memory 106 further includes an intermediate data structure module 110 generally configured to create intermediate data structures for the finite element model. The intermediate data structures are used to facilitate recognition of features in the finite element model. In order to recognize a feature on the finite element model, an intermediate data structure (e.g., described as a topology structure below) is built on the input mesh of the finite element model. The input mesh is subdivided into several mesh regions, and a mesh topology is built on each region. Boundary vertices and sides are defined for each mesh region. In other words, intermediate data structure module 110 is configured to build a mesh topology on each region of the finite element model; the mesh topology may be used by feature recognition module 112 to perform feature recognition.

Memory 106 further includes a feature recognition module 112 generally configured to perform feature recognition on each mesh region identified by module 110. Feature recognition module 112 may use various calculations and checks to identify the features. For example, to identify a cylinder in the finite element model, the following checks may be performed: a topology check (e.g., cylinders have two boundary loops, each loop being circular without a vertex), a geometry check (e.g., each loop is a circle), a curvature check (e.g., checking curvature at several sample points on the mesh region), and a straightness check (e.g., on the line segments of the cylinder). For other features, any combination of topology checks, geometry checks, curvature/straightness checks, size checks, or other checks may be performed by feature recognition module 112.

Modules 108-112 of memory 106 are generally configured to identify features in a given finite element module. Memory 106 further includes a CAD model creation module 114 configured to generate a CAD model based on the identified features in the finite element module. CAD model creation module 114 is configured to extract features and their associated feature parameters from the finite element model. The features are combined to create higher level features. For example, related features (e.g., a hole and a cylinder that are collocated and share a diameter) are combined. A CAD based feature tree is created from the features using the CAD software.

It should be understood that memory 106 may further include additional modules, the functionality of one or more modules may be combined or split up into different functional modules, or any other variation may be possible. The embodiment shown in FIG. 1 is provided by way of example only and is not limiting. The activities of modules 106-114 are described in greater detail with respect to process 200 of FIG. 2 and subsequent figures as described below.

Figure 2:
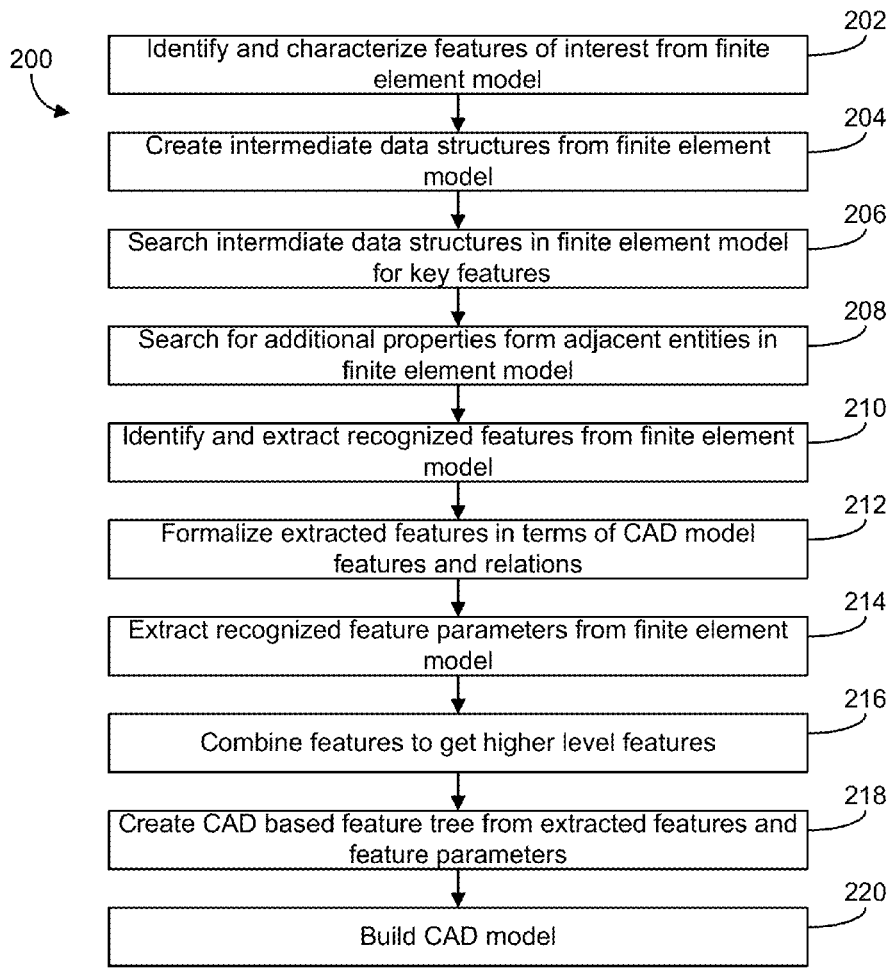
FIG. 2 is a flow chart of a process of generating a CAD model using features extracted from a finite element mode.

Referring to FIG. 2, a flow chart of a process 200 for generating a CAD model from a finite element model is shown, according to an exemplary embodiment. Process 200 may be executed by, for example, CAD system 100 and more particularly the modules of memory 106 as described above. Process 200 may be executed for a received finite element model to convert into a feature-based CAD model.

Process 200 includes identifying and characterizing features of interest from a finite element model (step 202). Step 202 may be executed by, for example, feature identification module 108 of CAD system 100. At step 202, pre-defined geometrical patterns are created on the finite element model that are used to recognize features on the finite element model. In other words, geometrical patterns are created that allow future steps of process 200 to more easily identify actual patterns on the finite element model. For example, simple features may include cylinders, chamfers, fillets, four-sided faces, holes, rings, frustrums, disks, etc. Some example feature types are illustrated in FIGS. 3A-E, and an example implementation of step 202 is described in further detail with respect to FIGS. 3F-H.

In some embodiments, at step 202, other more complex types of features may be identified. For example, semi-features, quarter-features, or other such features may be identified, such as semi-cylinders or quarter-cylinders, semi-rings or quarter-rings, or semi-disks or quarter-disks. Some examples of these feature types are illustrated in FIGS. 3I-L.

In some embodiments, composite features may be identified at step 202. For example, features such as washers (i.e., several connected concentric rings), rolling fillets (i.e., several consecutive connected fillets and corner fillets), beads (several circular layers of rolling fillets with or without a centric disk region), or flanges (several layers of rolling four-sided features) may be identified. It should be understood that according to various embodiments of the invention, all or any portion or combination of the above feature types may be identified at step 202, and CAD system 100 may be configured to particularly include or exclude certain feature types during feature identification.

Process 200 further includes creating intermediate data structures from the finite element model (step 204). Step 204 may be executed by, for example, intermediate data structure module 110 of CAD system 100. At step 204, intermediate data structures are created that are used to facilitate recognition of features in the finite element model. The mesh of the finite element model may be subdivided into several mesh regions, and an intermediate data structure is built for each mesh region. A boundary loop and boundary vertices and edges may be defined for each intermediate data structure. The boundary loops, vertices, and edges may be defined by using the identified characteristics in the finite element model. For example, the boundary loops, vertices, and edges may be formed based on the diameter, shapes, and curvatures of various potential features in the finite element model. The process of creating an intermediate data structure is described in greater detail in FIG. 4.

Figure 5A:
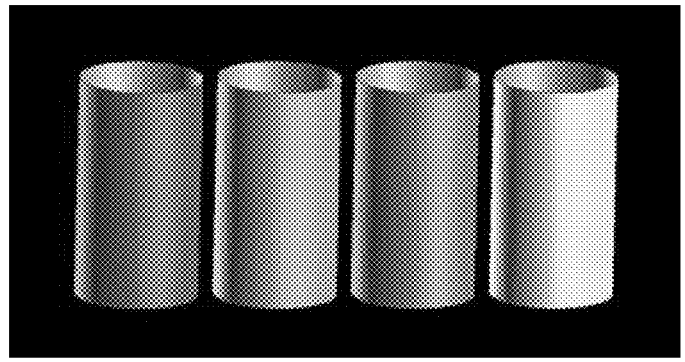
FIGS. 5A-C illustrate example features identifiable via the systems and methods described herein.
Figure 5B:
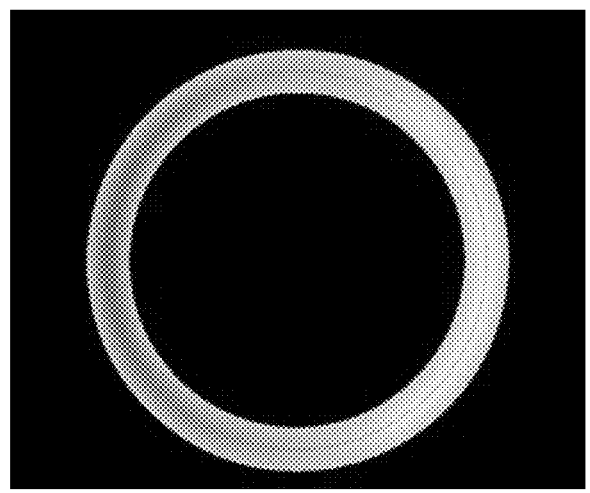
Figure 5C:
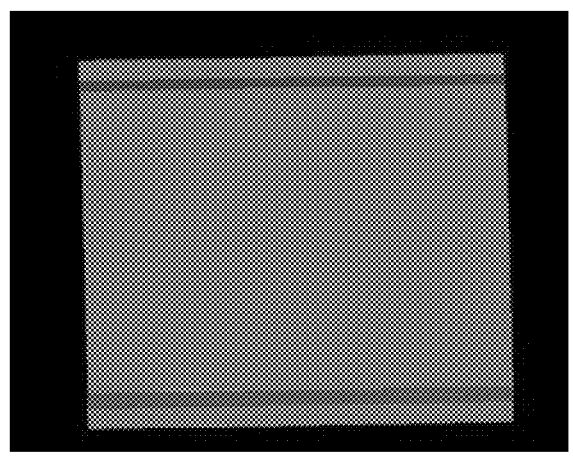

Process 200 further includes searching the intermediate data structures in the finite element model for key features (step 206) and searching for additional properties from adjacent entities in the finite element model (step 208). After building the intermediate data structures in step 204, feature recognition may be performed in each mesh region. A plurality of checks may be performed for each mesh region to identify the features. Different features may include different checks. For example, for a cylinder feature, a topology check may check if the mesh region has two boundary loops that are circular loops without a vertex (either end of the cylinder), a geometry check may check if the loops have similar radii, a curvature check and straightness check may check several sample points on a mesh region, and so forth. For another feature, different checks may be performed. Referring also to FIGS. 5A-C, example checks are described in greater detail. The additional properties from adjacent entities to the key features may be used to identify how the feature interact with adjacent features in the finite element model.

Process 200 further includes identifying and extracting recognized features from the finite element model (step 210). After the features are searched for and checked in steps 206-208, the features are extracted for use in creating the CAD model. In one embodiment, the features are selected by a user via an input device 120 and display device 122.

In one embodiment, the finite element model and more particularly the mesh regions of the finite element model may be displayed for a user via display device 122. The user may be able to identify features to extract from the finite element model via input device 120. For example, the user may click or drag on any feature or mesh region. The user interface provided via display device 122 may include any number of controls for assisting the user in selecting features. For example, the user interface may include a sensitivity bar that allows the user to choose how to have a border created around a selected object or feature (i.e., when the user selects a feature, a border for the feature is created that separates the feature from adjacent features). As another example, different characteristics or features may be displayed in different colors on the user interface. The user interface may include a browser tree (or other similar structure) that shows the total number of features selected, a total number of possible features, or any other information related to the user selections and possible user selections.

Process 200 further includes formalizing the extracted features in terms of CAD model features and relations (step 212). For example, the extracted features are matched with a library of features stored in CAD system 100. A comparison between the characteristics of the extracted features and the characteristics of the features in the library is performed, and the extracted features are fitted to match the features in the library. Step 212 may include any number of mesh fitting methods for formalizing the extracted features.

Process 200 further includes extracting recognized feature parameters from the finite element model (step 214). For example, if an extracted feature is a hole, the hole diameter is extracted at step 214. As another example, if an extracted feature is a pocket, the pocket depth is extracted at step 214. In one embodiment, the geometric API (application programming interface) of CAD system 100 may be configured to create the geometric features in the finite element model to extract.

Process 200 further includes combining simple extracted features to get higher level features (step 216) and creating a CAD based feature tree (step 218) from the features and parameters. The features that are combined may generally be features that are collocated and share a diameter, shape, curvature, or other characteristics with each other, and are in the same coordinate system. As one example, step 216 may include combining a hole feature and a cylinder feature that were adjacent to each other, sharing the same diameter, curvature, and coordinate system. Step 218 then includes linking the hole feature and cylinder feature in the CAD-based feature tree, automatically feeding parameters and other information for the features to the tree.

Process 200 further includes building the CAD model (step 220) using the CAD based feature tree. The CAD model may then be fully integrated and ready for automated simulation-based design approaches or any other use. Step 220 may generally include combining the various features and pieces of the model until the final full parametric CAD model is generated. Step 220 may include any type of sub-step for combining the combined features (e.g., filling in spots in the model in between features to properly connect the features together).

At steps 216-220, during combination of features and building of the CAD model, any number of surface fitting, trimming, or mesh segmentation steps may be executed to properly generate the CAD model. For example, one of a plurality of surface fitting methods may be used to fit a surface of a particular feature to another feature. As another example, one of a plurality of surface trimming methods may be used to create a smooth and well-fitting combination of features. As yet another example, one of a plurality of mesh segmentation methods may be used to divide mesh regions of the finite element model, in order to create a smoother fit between features. It should be understood that any number of mesh fitting techniques may be used during the creation of the CAD model based on the features of the finite element model.

Referring now to FIGS. 3A-E, example pre-defined geometrical patterns are illustrated, according to one embodiment. Each geometrical pattern 302-310 is an example of a pattern that may be created on the finite element model during step 202 of process 200. The patterns are used to recognize features on the finite element model that match the geometrical pattern. FIG. 3A illustrates a ring pattern 302 with a tria mesh. FIG. 3B illustrates a pair of ring patterns 304 with a quad mesh. FIG. 3C illustrates a frustrum pattern 306 with a quad mesh. FIG. 3D illustrates a frustrum pattern 308 with a tria mesh. FIG. 3E illustrates a disk pattern 310 with a feature mesh. The patterns have regular shapes and well-formed characteristics, and the parameter uv-lines of the patterns follow the direction of the curvature of the pattern, as illustrated in FIGS. 3A-E.

Figure 3F:
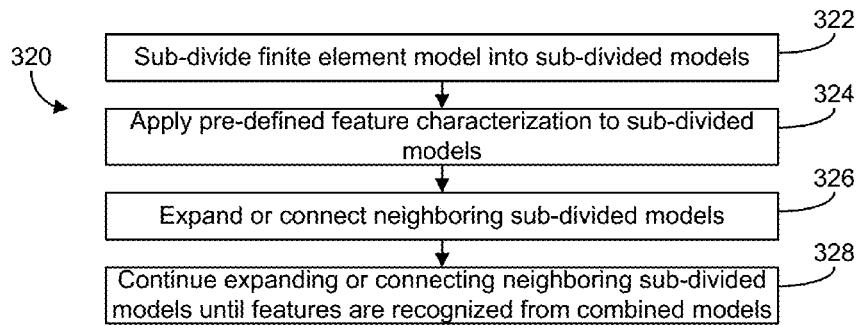
FIG. 3F is a flow chart of a process for identifying and characterizing features of interest in a finite element model.

Referring now to FIG. 3F, a process 320 for identifying and characterizing features of interest in a finite element model is shown, according to an exemplary embodiment. Process 320 may be executed at, for example, step 202 of process 200 for identifying and characterizing features of interest in a finite element model.

Process 320 includes sub-dividing the finite element model (step 322). The finite element model may be sub-divided into any number of sub-divided models such that each possible feature may generally be contained within a single sub-divided model. Each sub-divided model may include any number of edges, vertices, nodes, curves, or any other shapes or objects.

Process 320 further includes applying pre-defined feature characterization to the sub-divided models (step 324). The pre-defined feature characterizations may be retrieved from memory of CAD system 100 or received from a remote source. The characterizations may relate to general feature shapes and properties that may be used to generally identify potential features in each sub-divided model.

Process 320 further includes expanding or connecting neighboring sub-divided models (step 326). By combining sub-divided models, process 320 combines possible features to generate higher level features (i.e., by combining a hole feature and cylinder feature to generate a combined hole and cylinder feature that may be more easily identifiable by system 100). The combining also combined the pre-defined feature characterizations for each sub-divided model.

Process 320 further includes repeating the step of expanding or connecting neighboring sub-divided models, until each part of the finite element model is matched to a pattern (step 328). For example, sub-divided models are connected until a pattern relating to a possible feature is identified using the pre-defined feature characteristics.

Process 320 is described as a process for generally identifying features of interest in a model. Further processes (e.g., process 330 described below) may be executed for particular types of features. For example, after steps 322-324 of process 320, any type of feature may be recognizable by CAD system 100, and any number of steps specialized for the feature may be executed, such as those described below in process 330.

Figure 3G:
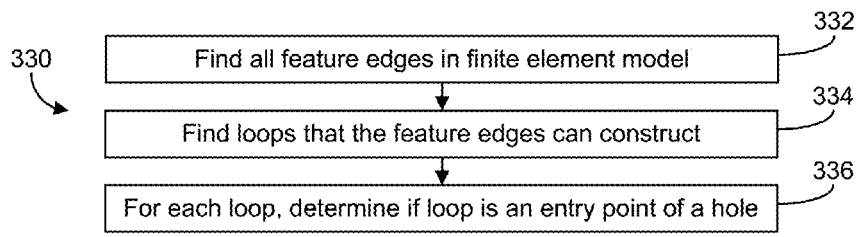
FIGS. 3G-H are a flow chart of a process and a diagram illustrating identifying and characterizing a particular feature of interest (e.g., a hole) in a finite element model.

Referring now to FIG. 3G, an example process 330 is shown for identifying a hole feature of interest in a finite element model. It should be understood that the example process for the hole as described below may be modified to be executed for any other type of feature of interest.

Process 330 includes finding all feature edges in the finite element model (step 332). The feature edges are found in terms of the provided feature angle of the finite element model. Process 330 further includes finding loops that the feature edges can construct (step 334). Each loop formed by a feature edge may potentially form a hole feature in the finite element model. With respect to step 202 of process 200, steps 332, 334 may be executed by first creating a pre-defined hole pattern and using the pattern to identify potential hole features. For example, the pre-defined hole pattern may be used to identify possible feature edges and loops.

Process 330 further includes determining if each found loop is an entry point of a hole (step 336). Step 336 may include ensuring that a loop is left-hand oriented (i.e., the left side of the loop is in the interior of the loop), estimating a normal at each vertex of the loop, and checking all loop vertices against a "normal test", described below with reference to FIG. 3H. If the normal test is broken at any loop vertex, the loop is not a hole entry; otherwise the loop is considered a hole entry and the hole feature is identified.

Figure 3H:
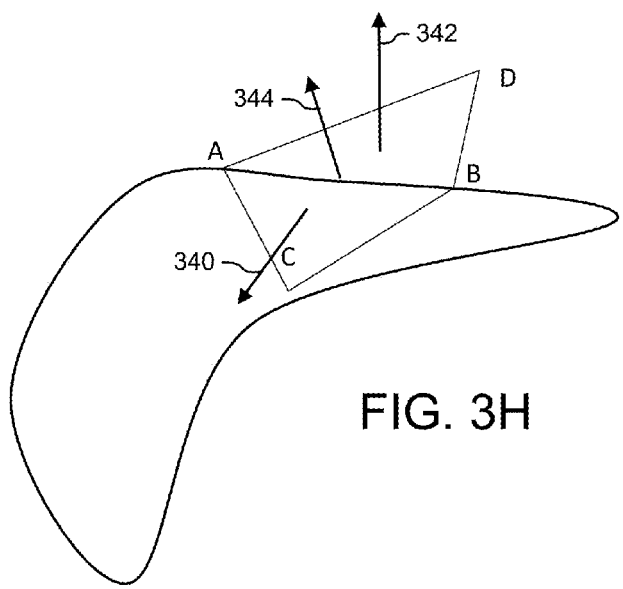

Referring to FIG. 3H, the normal test is illustrated in greater detail. AB is an edge in the loop of interest. ABC and ABD are two triangles connecting to edge AB. There are three normals: arrow 340 is the normal of triangle ABC, arrow 342 is the is the normal of triangle ABD, and arrow 344 is the normal of the loop estimated at step 336. If n denotes the cross product from arrow 344 to edge AB, then edge AB breaks the normal test if the angle between n and arrows 340, 342 are both greater than 85 degrees.

Figure 3I:
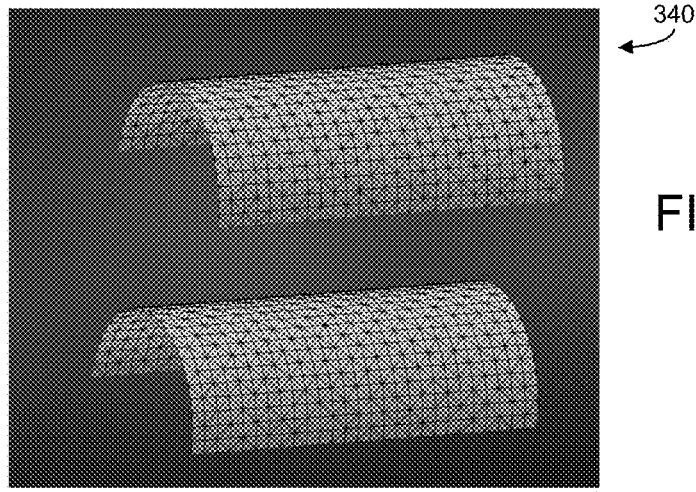
FIGS. 3I-3L illustrate further example features of interest that may be identified on a finite element model.
Figure 3J:
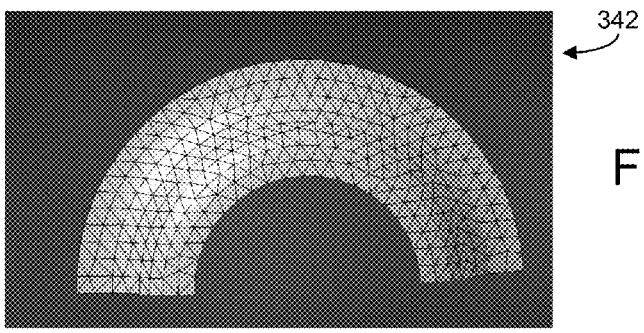
Figure 3K:
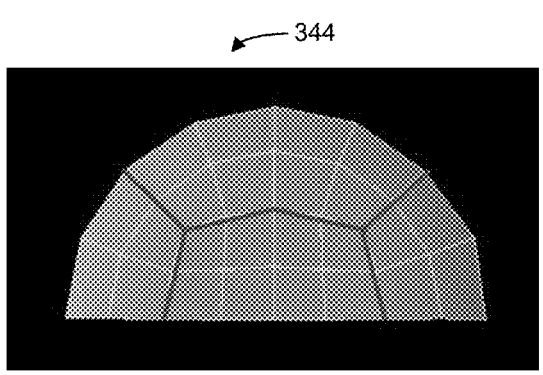
Figure 3L:
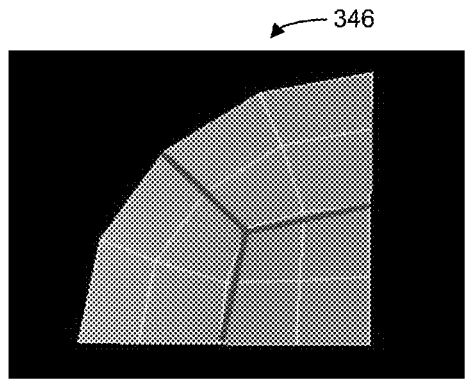

Referring now to FIGS. 3I-L, further example pre-defined geometrical patterns are illustrated, according to one embodiment. As shown in FIGS. 3I-L, CAD system 100 may be configured to identify semi-features, quarter-features, or other such features in the finite element model at step 202 of process 200. For example, FIG. 3I illustrates a pair of semi-cylinder features 350 with a tria mesh. FIG. 3J illustrates four semi-ring features 352 with a tria mesh. FIG. 3K illustrates a semi-disk feature 354 with a quad mesh. FIG. 3L illustrates a quarter-disk feature 356 with a quad mesh.

Figure 4:
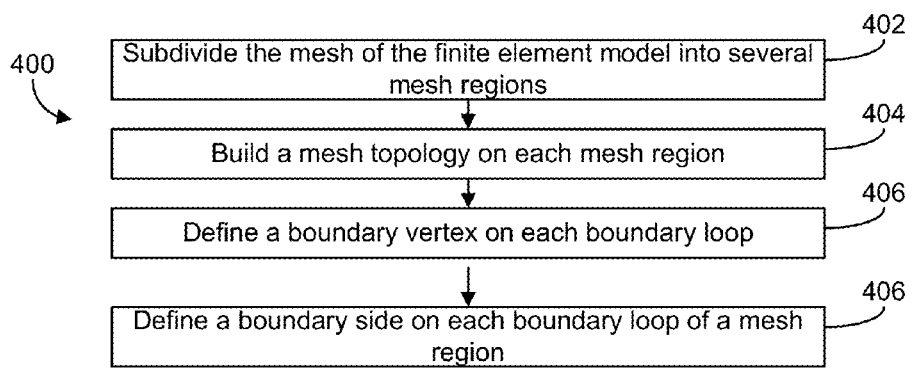
FIG. 4 is a flow chart of a process for creating intermediate data structures for a finite element model.

Referring now to FIG. 4, a flow chart of a process 400 for creating intermediate data structures from a finite element model is shown, according to an exemplary embodiment. Process 400 may be executed at, for example, step 204 of process 200.

Process 400 includes subdividing the mesh of the finite element model into several mesh regions (step 402). The region boundary for each mesh region may be determined by the angle between two adjacent elements in the model, user-defined attributes, and mesh connectivity.

Process 400 further includes building a mesh topology on each mesh region (step 404). Each mesh region may be bounded by one or more boundary loops. If a mesh region includes more than one boundary loop, the outermost loop is determined and used as the boundary loop.

Process 400 further includes defining a boundary vertex on each boundary loop (step 406). For example, a vertex of a boundary loop is a node on the boundary, with an angle between two adjacent boundary edges less than 150 degrees or greater than 210 degrees. As another example, if the mesh region is a four-sided feature, the vertex of the boundary loop may be a corner point of the four-sided feature, where the vertex-angle between two adjacent edges is between 70 degrees and 110 degrees. In other embodiments, any other type of geometric test may be used to determine the boundary vertex. Some boundary loops may not have a vertex (e.g., a circular loop), and step 406 may include determining that the boundary loop does not have a vertex and not defining a boundary vertex.

Process 400 further includes defining a boundary side on each boundary loop of a mesh region (step 408). For cases in which a boundary loop has two or more vertices, a boundary side may be determined that is the boundary edge between two consecutive boundary vertices. For cases in which a boundary loop has zero or one vertex, the boundary side is all the edges on the boundary loop.

Therefore, as a result of the activities of process 400, intermediate data structures are created in the finite element model. The intermediate data structures include a plurality of mesh regions, each mesh region bounded by a boundary loop. A boundary vertex and boundary sides are defined for each boundary loop.

Referring to FIGS. 5A-C, example features identifiable via the systems and methods described herein are illustrated. More particularly, FIG. 5A illustrates a plurality of cylinders, FIG. 5B illustrates a ring, and FIG. 5C illustrates a 4-sided face. The example features are described below with respect to various checks that may be performed on them as described in steps 206-208 of process 200. These checks are used to identify and verify the features. The features may then be extracted in subsequent steps of process 200. It should be understood that the checks are provided by way of example only and different or additional checks may be used for any type of feature.

Referring also to FIG. 2, at steps 206-208, intermediate data structures in the finite element model are searched for key features, and additional properties from adjacent entities are searched. A plurality of checks may be used to search for the key features and properties. For example, for a cylinder, the following checks may be performed. A topology check may be used to check the boundary loops of the mesh region. A cylinder has two boundary loops, and each loop is a circular loop without a vertex. A geometry check may be used to check the boundary loops. Both boundary loops of a cylinder are a circle, and should have similar radii. Further, the line segment connecting the two centers of the circular boundary loops should be perpendicular to the normal of the each circle; this line segment is the axis of the cylinder and the length of the line segment is the height of the cylinder. A curvature check may be used to check the two boundary loops of the cylinder. Curvatures may be calculated at several points in the mesh region; the maximum curvature at each point should be the same, and the minimum curvature at each point should be zero. The principal curvature direction corresponding to the minimum curvature at each point should be parallel to the axis. A straightness check may be used to check the two boundary loops of the cylinder. Several sample points on a circle of the cylinder may be selected; the point is projected onto the other circle and a line segment is formed between the point and its projection. The line segment should be parallel to the axis. Further, the line segment is checked to see if it is on the mesh region by projecting several points on the segment onto the mesh region.

As another example, for a ring feature, the following checks may be performed. A topology check may be performed to check the boundary loops. A ring has two boundary loops, each loop a circular loop without a vertex. A geometry check may check the circular loops. The two circular loops should have different radii. The centers of the two circles may be connected to form a line segment. If the length of the line segment is greater than zero, it should be perpendicular to the normal of each circle and the line segment is the axis of the ring. If the length of the line segment is zero, the two circles have the same center, and the normal of the two circles should be the same. A size check may be performed on the circles. The difference of the radii of the two circles should be greater than zero and less than (4*element size) (the maximum radius difference is set to prevent defining a ring feature with too many element layers). The straightness check may be performed. Several sample points on a circle are selected and projected onto the other circle. The point and its projection are connected to form a line segment, and the line segment is checked to determine if it lies on the mesh region. Each line segment formed should have a similar length.

As another example, for a 4-sided region, the following checks may be performed. For a topology check, the 4-sided region has only one loop with four sides. For the geometry check, each vertex should be a corner point of the 4-sided region. A node on the boundary is a corner point is the angle between two adjacent edges is greater than 70 degrees and less than 110 degrees. For the size check, the lengths of the opposite sides of the mesh region should be similar. Further, a size check may be performed for the interior of the mesh region. Several cross-sections are selected along each pair of opposite sides. The length of each cross-section is calculated; the length should be similar to the length of the corresponding opposite side.

After the feature and feature properties are determined, the details may be loaded and stored for use in creation of the CAD model. In one embodiment, the feature properties may be stored in a data structure. As an example, for a ring feature, the data structure may generally include one or more identifiers for the ring feature, the number of seeds or nodes in the ring feature, the size of the ring feature, the radius of the circular portion of the ring feature, the number of element layers, etc. One example implementation of a data structure of a ring feature is provided below:

```
/! Data structure for ATT_TYP_FEATURE_RING
typedef struct ATTTIB_DATA_RING_
{
int id;
unsigned int flag;
int mappPattern;
//! circularNumSeed, circularMeshSize, and circularAng-
PerElem are used
//! To control mesh size in circular direction, but only one
parameter will be used.
//! if circularNumSeed>0, use circularNumSeed for mesh
control;
//! else if circularMeshSize>0.0, use circularMeshSize;
//! else if circularAngPerElem>0, use circularAngPerElem.
//! if all<=0.0, use global size control
int circularNumSeed; //!<number of seeds in circular direction
double circularMeshSize; //!<mesh size in circular direction
double circularAngPerElem; //!<angle per element in circular direction
//! These two parameters are used for mesh control in radius direction but
//! only one parameter will be used.
//! if radiusMeshsize>0, use radiusMeshsize and ignore nElemLayer
//! else if nElemLayer>0, use nElemLayer
//! if all<=0.0, use global size control.
double radiusMeshsize; //!<mesh size in radius direction
int nElemLayer; //!<number of element layers on the ring
} ATTTIB_DATA_RING;
```

The terms "system", "logic", "data processing apparatus" or "computing device" encompasses all kinds of circuits, apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question (e.g., code that constitutes processor firmware, a protocol stack, a database management system, an operating system, a cross-platform runtime environment, a virtual machine, or a combination of one or more of them). The apparatus and execution environment can realize various different computing model infrastructures, such as web services, distributed computing and grid computing infrastructures.

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements may be reversed or otherwise varied and the nature or number of discrete elements or positions may be altered or varied. Accordingly, all such modifications are intended to be included within the scope of the present disclosure. Other substitutions, modifications, changes, and omissions may be made in the design, operating conditions and arrangement of the exemplary embodiments without departing from the scope of the present disclosure.

The present disclosure contemplates methods, systems and program products on any machine-readable media for accomplishing various operations. The embodiments of the present disclosure may be implemented using existing computer processors, or by a special purpose computer processor for an appropriate system, incorporated for this or another purpose, networked systems or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a general purpose computer, special purpose computer, or special purpose processing machines to perform a certain function or group of functions. The machine-executable instructions may be executed on any type of computing device (e.g., computer, laptop, etc.) or may be embedded on any type of electronic device (e.g., a portable storage device such as a flash drive, etc.).

Although the figures may show a specific order of method steps, the order of the steps may differ from what is depicted. Also, two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

What is claimed is:

1. A method of creating a computer-aided design (CAD) model from a finite element model, the method comprising:
   identifying and characterizing features of interest from the finite element model; creating multiple intermediate data structures of the finite element model by dividing the finite element model into mesh regions based on the features of interest;
   performing feature recognition on each of the intermediate data structures to identify finite element model features;
   extracting the finite element model features from the finite element model; and
   creating the CAD model using the finite element model features;
   wherein creating the CAD model comprises:
   formalizing the features extracted from the finite element model in terms of CAD model features and settings;
   wherein creating the CAD model further comprises:
   combining some of the finite element model features to obtain higher level features;
   creating a CAD feature tree using the higher level features; and using the CAD feature tree to build the CAD model.

2. The method of claim 1, wherein formalizing the features extracted from the finite element model comprises one or more of a surface fitting function, a surface trimming function, and a mesh segmentation function.

3. The method of claim 1, wherein identifying and characterizing features of interest from a finite element model comprises:
   creating pre-defined geometrical patterns on the mesh of the finite element model; and
   using the pre-defined geometrical patterns to recognize features of interest on the finite element model.

4. The method of claim 1, wherein creating intermediate data structures of the finite element model comprises:
   subdividing the finite element model into multiple mesh regions;
   building a mesh topology on each mesh region; and
   defining boundary vertices and boundary edges on each mesh region.

5. The method of claim 1, wherein performing feature recognition on each intermediate data structure comprises a plurality of checks of one or more parameters of each mesh region.

6. The method of claim 5, wherein the one or more parameters include at least one of a straightness or curvature of a line, a geometric shape of the mesh region, a topology check of the mesh region, or a size of one or more components of the mesh region.

7. A system, comprising a processing circuit configured to: identify and characterize features of interest from the finite element model;
   create multiple intermediate data structures of the finite element model by dividing the finite element model into mesh regions based on the features of interest;
   perform feature recognition on each of the intermediate data structures to identify finite element model features;
   extract the finite element model features from the finite element model; and create the CAD model using the finite element model features;
   wherein creating the CAD model comprises: formalizing the features extracted from the finite element model in terms of CAD model features and settings;
   wherein creating the CAD model further comprises:
   combining some of the finite element model features to obtain higher level features;
   creating a CAD feature tree using the higher level features; and using the CAD feature tree to build the CAD model.

8. The system of claim 7, wherein formalizing the features extracted from the finite element model comprises one or more of a surface fitting function, a surface trimming function, and a mesh segmentation function.

9. The system of claim 7, wherein identifying and characterizing features of interest from a finite element model comprises:
    creating pre-defined geometrical patterns on the mesh of the finite element model; and
    using the pre-defined geometrical patterns to recognize features of interest on the finite element model.

10. The system of claim 7, wherein creating intermediate data structures of the finite element model comprises:
    subdividing the mesh of the finite element model into multiple mesh regions;
    building a mesh topology on each mesh region; and
    defining boundary vertices and boundary edges on each mesh region.

11. The system of claim 7, wherein performing feature recognition on each intermediate data structure comprises a plurality of checks of one or more parameters of each mesh region.

12. The system of claim 11, wherein the one or more parameters include at least one of a straightness or curvature of a line, a geometric shape of the mesh region, a topology check of the mesh region, or a size of one or more components of the mesh region.

13. A tool for creating a CAD model from a finite element model, wherein the tool is configured to:
    identify and characterize features of interest from the finite element model; create multiple intermediate data structures of the finite element model by dividing the finite element model into mesh regions based on the features of interest;
    perform feature recognition on each of the intermediate data structures to identify finite element model features;
    extract the finite element model features from the finite element model; and create the CAD model using the finite element model features;
    wherein creating the CAD model comprises:
    formalizing the features extracted from the finite element model in terms of CAD model features and settings;
    formalizing the features extracted from the finite element model in terms of CAD model features and settings;
    wherein creating the CAD model further comprises:
    combining some of the finite element model features to obtain higher level features;
    creating a CAD feature tree using the higher level features; and using the CAD feature tree to build the CAD model.

14. The tool of claim 13, wherein formalizing the features extracted from the finite element model comprises one or more of a surface fitting function, a surface trimming function, and a mesh segmentation function.

\* \* \* \* \*